United States Patent
Huang et al.

(10) Patent No.: US 10,867,112 B2
(45) Date of Patent: Dec. 15, 2020

(54) METHODS OF MAKING MASK USING TRANSMISSION CROSS COEFFICIENT (TCC) MATRIX OF LITHOGRAPHY PROCESS OPTICAL SYSTEM

(71) Applicant: TAIWAN SEMICONDUCTOR MANUFACTURING CO., LTD., Hsinchu (TW)

(72) Inventors: Hsu-Ting Huang, Hsinchu (TW); Ru-Gun Liu, Zhubei (TW); Shinn-Sheng Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/453,463

(22) Filed: Jun. 26, 2019

(65) Prior Publication Data

US 2020/0004135 A1 Jan. 2, 2020

Related U.S. Application Data

(60) Provisional application No. 62/691,186, filed on Jun. 28, 2018.

(51) Int. Cl.
| | |
|---|---|
| *G06F 30/00* | (2020.01) |
| *G06F 30/398* | (2020.01) |
| *G03F 1/36* | (2012.01) |
| *G06F 30/20* | (2020.01) |
| *G03F 7/20* | (2006.01) |

(52) U.S. Cl.
CPC .............. *G06F 30/398* (2020.01); *G03F 1/36* (2013.01); *G03F 7/705* (2013.01); *G06F 30/20* (2020.01)

(58) Field of Classification Search
CPC ........ G06F 30/398; G06F 30/20; G03F 7/705; G03F 1/36
See application file for complete search history.

(56) References Cited

U.S. PATENT DOCUMENTS

| | | | | |
|---|---|---|---|---|
| 6,871,337 | B2 * | 3/2005 | Socha | G03F 1/36 |
| | | | | 250/492.22 |
| 7,587,704 | B2 * | 9/2009 | Ye | G03F 7/705 |
| | | | | 716/51 |

(Continued)

*Primary Examiner* — Naum Levin
(74) *Attorney, Agent, or Firm* — McDermott Will & Emery

(57) ABSTRACT

A method of making a mask includes computing a transmission cross coefficient (TCC) matrix for an optical system for performing a lithography process, wherein computing includes decomposing the transmission cross coefficient matrix into an ideal transmission cross coefficient (TCC) kernel set for a corresponding ideal optical system and at least one perturbation kernel set with coefficients corresponding to optical defects in the optical system, calibrating a lithography model by iteratively adjusting the lithography model based on a comparison between simulated wafer patterns and measured printed wafer patterns, and providing the calibrated lithography model, which includes an ideal TCC kernel set and the at least two perturbation kernels sets and a resist model, to a mask layout synthesis tool to obtain a synthesized mask layout corresponding to a target mask layout for manufacturing the mask using the synthesized mask layout.

21 Claims, 5 Drawing Sheets

(56) References Cited

U.S. PATENT DOCUMENTS

| | | | |
|---|---|---|---|
| 7,873,204 B2* | 1/2011 | Wihl | G03F 1/84 |
| | | | 382/144 |
| 8,120,753 B2* | 2/2012 | Berger | G03F 7/70216 |
| | | | 355/67 |
| 8,238,644 B2* | 8/2012 | Brunner | G03F 1/36 |
| | | | 382/144 |
| 8,379,991 B2* | 2/2013 | Cao | G03F 1/36 |
| | | | 382/218 |
| 8,739,080 B1 | 5/2014 | Tsai et al. | |
| 8,745,550 B2 | 6/2014 | Cheng et al. | |
| 9,355,200 B2* | 5/2016 | Chen | G06F 30/39 |
| 9,529,959 B2 | 12/2016 | Wang et al. | |
| 9,645,509 B2* | 5/2017 | Cao | G03F 7/705 |
| 9,679,100 B2 | 6/2017 | Cheng et al. | |
| 9,715,170 B2* | 7/2017 | Jang | G03F 1/22 |
| 9,747,408 B2 | 8/2017 | Huang et al. | |
| 9,804,504 B2* | 10/2017 | Chen | G03F 7/70625 |
| 9,990,460 B2 | 6/2018 | Huang et al. | |
| 10,210,295 B2* | 2/2019 | Rosenbluth | G03F 7/70091 |
| 2011/0283244 A1 | 11/2011 | Abdo et al. | |
| 2014/0114634 A1 | 4/2014 | Song et al. | |
| 2014/0220786 A1 | 8/2014 | Lukanc et al. | |
| 2015/0113486 A1 | 4/2015 | Wang | |
| 2017/0147733 A1* | 5/2017 | Rosenbluth | G03F 7/70283 |

* cited by examiner

METHODS OF MAKING MASK USING TRANSMISSION CROSS COEFFICIENT (TCC) MATRIX OF LITHOGRAPHY PROCESS OPTICAL SYSTEM

CROSS REFERENCE TO RELATED APPLICATION

This application claims priority of U.S. Provisional Patent Application No. 62/691,186 filed on Jun. 28, 2018, the entire contents of which are incorporated herein by reference.

BACKGROUND

Creating accurate masks used in lithography processes for making integrated circuits is more challenging as the feature sizes of integrated circuits get smaller. As the feature size decreases below the diffraction limit of optical systems used in lithography, distortions resulting from higher order optical effects may create unwanted features in the pattern generated on the wafer. Further, as pattern density increases, intensity of light diffracted from neighboring patterns is no longer negligible. Moreover, the variation in the lens pupil function across the exposure slit is not negligible for smaller wavelengths, such as those used in extreme ultraviolet (EUV) lithography.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
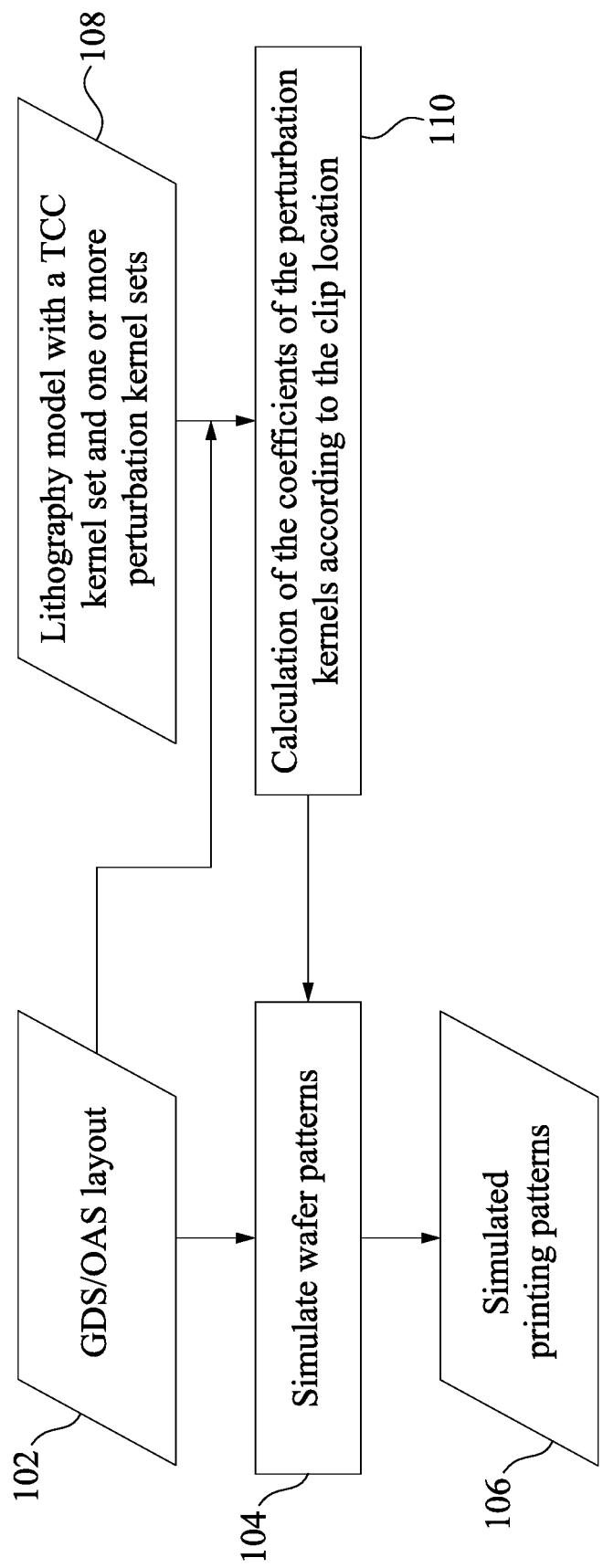
FIG. 1 schematically illustrates a method for simulating wafer pattern for a given mask layout using calculated coefficients of perturbation kernels in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

While methods disclosed herein are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Terms like "simulate," "optimize," "adjust," "creating," "manufacture," "fabricate," "make," "form," "compare," "generate," "choose," "determine," "calculate," "measure," are used to describe operations of the disclosed methods, apparatus, or system. These terms denote the operations that are performed, for example, by one or more computers connected to or disconnected from a network and having a user interface to receive the user/designer's inputs and/or commands and a data communication interface or a network interface so as to exchange data with semiconductor manufacturing tools including, but not limited to, a lithography tool and an e-beam writer, and semiconductor testing (or characterization, measurement, or metrology) tools including, but not limited to, a scanning electron microscope. The operations that correspond to these terms can vary depending on the particular implementation and are readily discernible by one of ordinary skill in the art.

Some or all of the disclosed techniques/operations/steps can be implemented in whole or in part by software comprising computer-executable instructions stored on a computer-readable medium. Such software can comprise, for example, an appropriate electronic design automation ("EDA") software tool. Such software can be executed on one or more computers or computer systems. For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language.

Any of the disclosed methods can alternatively be implemented (partially or completely) in hardware such as processors, transitory and non-transitory memory devices, and various circuits.

Because of the complexity of some electronic design automation processes and the large size of many circuit designs, various electronic design automation tools are configured to operate on a computing system capable of simultaneously running multiple processing threads or multiple processors. The components and operation of a computer network may include a host or master computer and one or more remote or servant computers.

Any data produced from any of the disclosed methods (e.g., intermediate or final test patterns, test pattern values, parameters, or control data) can be stored on a computer-readable storage medium (e.g., tangible computer-readable medium, such as one or more critical dimensions (CDs), volatile memory components (such as Dynamic Random Access Memory (DRAM) or Static Random Access Memory (SRAM)), or nonvolatile memory components (such as hard drives)), using a variety of different data structures or formats. Such data can be created, updated, or stored using a local computer or over a network (e.g., by a server computer), and can be exchanged among the computers, the semiconductor manufacturing tools, and the semiconductor testing tools.

In some embodiments, a photomask refers to a patterned substrate used in a lithography process to pattern a photoresist coated on a semiconductor wafer. In the following description, photomask, mask and reticle are used exchangeably. Although only one photomask is to be described in some embodiments, one of ordinary skill in the art should understand that more photomasks can be manufactured in accordance with the design principles of this disclosure so that various layers can be made with the photomasks to construct an integrated circuit.

In some embodiments, mask layout, mask data, or electron beam shot map refer to a type of electronic file or data, which is readable by a semiconductor manufacturing tool or a semiconductor testing tool to allow the semiconductor manufacturing tool or the semiconductor testing tool to obtain information contained in the electronic file or data. The information includes, but is not limited to, locations in a mask to be manufactured and properties of such locations (i.e., whether to allow portions of a photoresist layer to remain or be removed after being exposed with the manufactured mask based on such electronic file or data, followed by a developing process).

In some embodiments, a semiconductor manufacturing tool or a semiconductor testing tool refers to a tool including, but not limited to, one of a motor; optical components such as a light source or lens; an image capturing device; and a computer including a processor; a user interface; transitory and/or non-transitory computer-readable storage medium; and software, program, or instructions stored on the non-transitory computer-readable medium, that when executed, cause the processor of the computer to generate commands to control operations of hardware or software modules of the semiconductor manufacturing tool or the semiconductor testing tool.

In forming a mask used in lithography techniques, initially, a layout of test structures (or of an IC) is formed or otherwise designed. The layout of the test structures (or of the IC) is formed in a data format such as, for example, a graphic data system (GDS or GDSII) or an open artwork system interchange standard (OASIS or OAS) proposed by Semiconductor Equipment and Materials International (SEMI) in various embodiments. In some embodiments, the layout is generated using a computer implementing an electronic design automation (EDA) software or tool. For the purposes of the present disclosure, unless explicitly stated otherwise or made clear by the context, the terms "layout", "mask layout", "IC layout", "test layout" are used interchangeably.

In some embodiments, the test design layout or the IC design layout includes one or more layers of circuit patterns designed for an IC product, based on the specification of the IC product. The layout is designed by a designer in some embodiments. In one example, the designer is a design house. In another example, the designer is a design team separated from a semiconductor manufacturer that is capable of making IC products according to the IC design layout. In various embodiments, the semiconductor manufacturer is capable of making photomasks, IC products, or both. The designer, based on the specification of the product to be manufactured, implements a proper design procedure to generate the IC design layout. The design procedure includes logic design, physical design, and/or place and route in some embodiments. As an example, a portion of the IC design layout includes various IC features (also referred to as main features), such as active regions, doped wells, sources and drains, gate electrodes, vias/contacts and metal lines of the interlayer interconnection, and openings for bonding pads, to be formed in a semiconductor substrate (such as a silicon wafer) and various material layers disposed over the semiconductor substrate. The IC design layout, in some embodiments, also includes certain assist features, such as those features for imaging effect, process or product testing and/or calibration, and/or mask identification information.

In a case in which the layout is generated by a design house other than the semiconductor manufacturer, the method additionally includes another operation receiving, by the semiconductor manufacturer, electronic data of the generated layout delivered from the design house. The electronic data of the generated layout can be delivered by internet or a portable data storage, or combination thereof. The semiconductor manufacturer can use the received electronic data of the generated layout to perform the remaining operations.

A lithography model that has been calibrated for a desired location on a photomask is obtained. The lithography model is one of multiple lithography models each calibrated for different locations on the photomask. For instance, lithography models 1, 2, . . . , N each calibrated for respective different locations 1, 2, . . . , N on the photomask are obtained. In addition, transmission cross coefficient (TCC) kernel sets each for a location 1, 2, . . . , N on the photomask are also obtained.

The photomask can be designed in various suitable technologies. In one embodiment, the mask is designed to have a binary pattern. In this case, the mask pattern includes dark regions and bright regions. The radiation beam (e.g. ultraviolet or electron beam), used to expose the photo-sensitive material layer (such as photoresist) coated on a wafer, is blocked by the dark region and transmits through the bright regions. In one example, the binary mask includes a transparent substrate (e.g., fused quartz), and an opaque material (e.g., chromium) coated in the dark regions of the mask.

In another embodiment, the mask is designed to have phase shift and can be referred to as a phase shift mask, various features in the pattern formed on the mask are configured to have proper phase differences to enhance the resolution and imaging quality. In various examples, the phase shift mask can be an attenuated phase shift mask or an alternating phase shift mask known in the art.

In some other embodiments, the mask is an extreme ultraviolet (EUV) mask having a reflective pattern. In one example, the EUV mask includes a substrate with a suitable material, such as a low thermal expansion material (LTEM). In various examples, the LTEM includes fused quartz, $TiO_2$ doped $SiO_2$, or other suitable materials with low thermal expansion. The EUV mask includes reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The EUV mask may further include a capping layer, such as ruthenium (Ru), disposed on the ML for protection. The EUV mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is appropriately patterned to define a layer of an integrated circuit, thereby forming an EUV phase shift mask Using a lithography model for a location on the photomask and the corresponding TCC kernel set for the same location on the photomask, optical proximity correction (OPC) operations are performed to assure wafer printing fidelity. OPC is one lithography technique used to tune (e.g., correct or enhance) the mask layout for improved imaging effect. The objective of the OPC process is to reproduce on the wafer, the original layout drawn by the IC designer. For example, OPC can be used to compensate for image errors due to optical diffraction or process effects. OPC helps to maintain the edge of the original mask layout (or design layout) in the patterned image on the wafer. If not compensated, after processing, the images patterned on the wafer can appear with irregularities such as line widths that are narrower or wider than designed. OPC can compensate for such irregularities by changing (e.g., correcting) the pattern of the photomask layout.

After OPC is performed to make the adjustments to the photomask layout, the modified layout may need inspection. Inspection can be performed to identify areas (hotspots) of the OPCed photomask layout that may not be properly printed on the wafer and may produce defective areas on the wafer, e.g., areas on the wafer that pinching (open circuit) and/or bridging (short circuit) may occur. The hotspots are regions of the photomask layout that may produce the defective areas on the wafer after performing the lithographic process to produce the design mask layout on the wafer.

In some embodiments, after inspecting the mask layout and finding the hotspots, the hotspots are fixed, e.g., corrected or enhanced. To remedy the problem of creating the defective areas on the wafer, inverse lithographic technology (ILT), is applied to the mask layout. In some embodiments, the ILT is applied through an iterative process.

Because multiple lithography models having different TCC kernel sets are utilized, at the boundary of two neighboring lithography models, OPCed layout may have jogs (e.g., discontinuities), which may result in discontinuity of the wafer patterns and even wafer edge placement error (EPE) violations near the boundary. Multiple TCC kernels require increased memory. For memory management, OPC on different locations of the mask is performed separately on different groups of computers, which increases the complexity of the computation process.

Each TCC kernel set for a location on the photomask is derived from a TCC matrix through a singular value decomposition (SVD) process or other desired processes to calculate Eigen-vectors and Eigen-values. The below equations are representative of how a TCC matrix and kernel set are obtained using a vectorial imaging theory, for instance.

$$I(x) = \sum_{\alpha,\beta} \int\int d^2 f'' \int\int d^2 f' \tilde{T}^*_{\alpha\beta}(f'')\tilde{T}_{\alpha\beta}(f') \quad \text{Equation (1)}$$

$$\exp(i(f'-f'')\cdot x)TCC_{\alpha\beta}(f',f'')$$

where $$TCC_{\alpha\beta}(f',f'') = \int\int d^2 f^i I^i_\beta(f^i)\tilde{P}^*_\alpha(f''+f^i)\tilde{P}_\alpha(f'+f^i) = \quad \text{Equation (2)}$$

$$\sum_j |V_{\alpha\beta,j}(f'')\rangle\langle V_{\alpha\beta,j}(f')|$$

In Equations (1) and (2), $\alpha$ and $\beta$ are polarization states, $\tilde{P}_\alpha$ is the lens pupil function, f' and f'' are wave vectors of the diffraction fields, $f^i$ is the wave vector of the incident light wave, $\tilde{T}_{\alpha\beta}$ is the mask diffraction field from electromagnetic wave simulation, $TCC_{\alpha\beta}$ is the transmission cross coefficient matrix, $I_\beta^i$ is the intensity of the incident wave, $V_{\alpha\beta,j}$ is the j-th kernel of the TCC kernel set, $\tilde{T}_{\alpha\beta}$ (f') is the mask diffraction field at wave number f' with input field at $\beta$ polarization and output field at $\alpha$ polarization, and $\tilde{T}_{\alpha\beta}$ (f'') is the complex conjugate of $\tilde{T}_{\alpha\beta}$(f''). $\tilde{P}_\alpha$(f'+f$^i$) represents the pupil function $\tilde{P}_\alpha$ at the wave number f'+f$^i$.

Embodiments of the disclosure are directed to utilizing a single TCC kernel set with a set of perturbation kernels to account for position-dependent effects in full-chip OPC/ILT. According to example embodiments, only one lithography model is calibrated and it describes position dependent effects. By utilizing a single TCC kernel set, wafer edge placement error (EPE) violations at the boundary of two lithography models is minimized. Secondly, the lithography model is relatively consistent for all locations on the photo mask and the lens pupil function is different for different location on the photomask. As a result, existing computer processing techniques can be used and the process complexity and memory utilization are reduced.

FIG. 1 schematically illustrates a method for simulating wafer pattern for a given mask layout using calculated coefficients of perturbation kernels in accordance with an embodiment of the present disclosure. In an embodiment, the method includes, at 102, providing a GDS/OAS layout of structures to be simulated. At 108, a single lithography model with an ideal TCC kernel set and one or more perturbation kernel sets is obtained. The GDS/OAS layout obtained at 102 and the single lithography model with the ideal TCC kernel set and one or more perturbation kernel sets obtained at 108 are used to calculate coefficients of the perturbation kernels based on the clip location or the through slit location on the photomask, as at 110.

The method further includes at 104, calculating a simulated wafer pattern using the calculated coefficients of the perturbation kernels obtained at 110. In some embodiments, instead of multiple location dependent TCC kernels, the optical system is represented by a product of an ideal TCC kernel set and one or more perturbation kernel sets having location dependent coefficients. In such embodiments, the ideal TCC kernel set models how the optical system affects transmission (or reflection in case of EUV) of light assuming that all the optical elements in the optical system have ideal characteristics. The perturbation kernel, then, represents the net effect of defects such as, for example, aberration, apodization, birefringence, etc., of all the non-ideal elements in the optical system, and the location dependent coefficients modulate the perturbation kernel based on where, relative to the mask layout, the patterns are present. At 106, a printed image of a clip of mask layout is computed using the ideal TCC kernel set and the one or more perturbation kernel sets with calculated coefficients of the perturbation kernel set(s).

Figure 2:
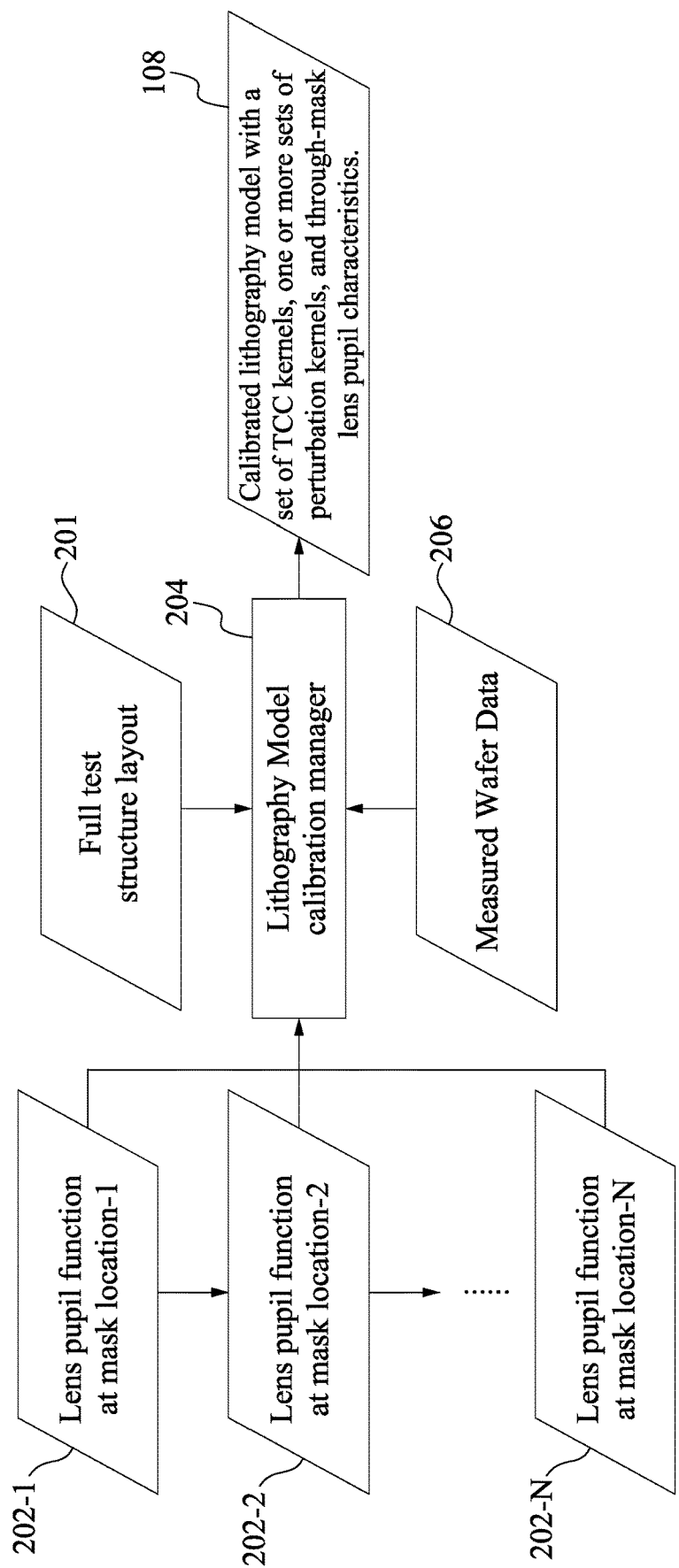
FIG. 2 schematically illustrates a method for obtaining the single lithography model with the ideal TCC kernel set and one or more perturbation kernel sets in operation in FIG. 1, in accordance with an embodiment of the present disclosure.

FIG. 2 schematically illustrates a method for obtaining the single lithography model with the ideal TCC kernel set and one or more perturbation kernel sets in operation 108 in FIG. 1, in accordance with an embodiment of the present disclosure. In an embodiment, the method includes obtaining lens pupil functions at different locations on the photomask. As illustrated in FIG. 2, the different lens pupil functions at different locations on the photomask are obtained at 202-1, 202-2, . . . , 202-N (collectively, 202). In an embodiment, the method also includes obtaining GDS/OAS layout of structures to be used for model calibration, as at 201. The model calibration process includes wafer image simulation and uses either the TCC matrix or the decomposed kernels for wafer image simulation. Therefore, layout 201 may be divided into smaller pieces and provided to at step 102 for wafer pattern simulation.

The different lens pupil functions obtained at 202 and the test structure layout obtained at 201 are provided to a lithography model calibration manager, as at 204. In addition, measured wafer data is also provided as at 206. The layout obtained at 201 is printed on a wafer (to obtain a printed wafer pattern) and the wafer is then measured using a metrology tool (e.g., CD-SEM) to obtain the wafer data. The lithography model calibration manager compares computed wafer patterns to measured wafer data, and adjusts model parameters to minimize the difference between the computations and the measurements. By matching the calculated printed patterns and the measured printed patterns, the lithography model calibration manager provides a calibrated lithography model 108. In an embodiment, the printed wafer pattern of a test structure is simulated using the method shown in FIG. 1. Wafer images are computed using ideal TCC kernels and one or more perturbation kernels. The coefficients of the perturbation kernels are calculated according to the mask location of the structure in the GDS/OAS layout.

Figure 3:
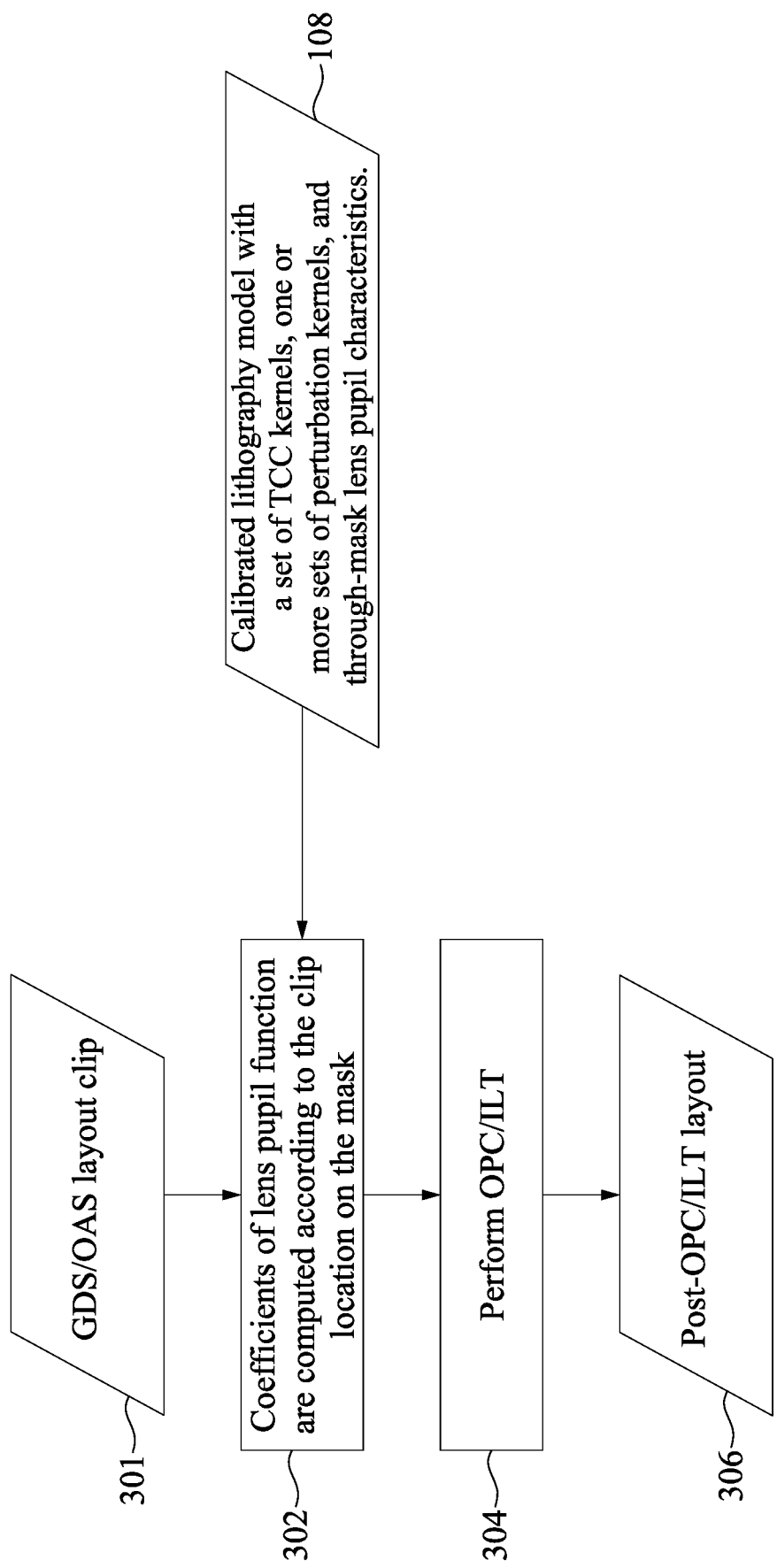
FIG. 3 schematically illustrates a method for performing OPC/ILT applications using the calibrated lithography model, and the TCC and perturbation kernel sets in accordance with an embodiment of the present disclosure.

FIG. 3 schematically illustrates a method for performing OPC/ILT applications using the calibrated lithography model, and the TCC and perturbation kernel sets in accordance with an embodiment of the present disclosure. In an embodiment, the calibrated lithography model is obtained at operation 108 in FIGS. 1 and 2. The method includes obtaining GDS/OAS layout of structures to be printed on a wafer. For a large GDS/OAS layout to be performed by OPC/ILT, the layout is usually divided into smaller clips, as at 301. Each clip is sent for the OPC/ILT process. There are overlapping areas between adjacent clips. It may be noted that the GDS/OAS layout used for OPC/ILT may be different from the test structure layout 201 used in model calibration in FIG. 2.

At 302, coefficients of the lens pupil function are computed according to the mask location of each OPC/ILT clip obtained at 301. During the OPC/ILT process 304, a printed wafer pattern is simulated using the method in FIG. 1. The mask layout will be optimized so the simulated printed pattern will match the target wafer pattern. In an embodiment, the OPC/ILT operation is performed on a distributed computing system in which each thread of computation deals with one layout clip. The coefficients of the lens pupil functions computed at 302 are used for the perturbation kernel sets obtained at 108 (FIG. 1) to simulate the printed wafer pattern. The coefficients of one or more perturbation kernels, coefficients $a_k$ and $b_k$ calculated as discussed below in this document, are then used together with ideal TCC kernels to calculate the printed patterns of each clip. The OPC/ILT process is performed by adjusting the mask layout to obtain desired calculated printed patterns. At 306, the optimized mask layout is generated for manufacturing the photomask in a subsequent process.

The pupil function $\tilde{P}_\alpha$ in Equation 2 above includes a low pass filter and a lens pupil function, and is represented as $$\tilde{P}_\alpha(f) = L(f) \cdot A_\alpha(f) \quad \text{Equation (3)}$$

In Equation (3), L represents the low pass filter and $A_\alpha$ represents a lens p lens pupil function $A_\alpha$ can be represented by a series of Zernike polynomials:

$$A_\alpha(f) = \exp\left\{i2\pi\left[\sum_k c_k Z_k(f)\right]\right\} \quad \text{Equation (4)}$$

In Equation (4), $Z_k$ is an even or an odd Zernike polynomial, $c_k$ is a complex number, and f is the wavenumber of the diffraction field. For a nearly perfect lens, the lens pupil function can be approximated as $$A_\alpha(f) \approx 1 + 2\pi i\left[\sum_k c_k Z_k(f)\right] \quad \text{Equation (5)}$$

Based on the above, the lens pupil function can then be approximated as $$\tilde{P}_\alpha(f) \approx L(f) + 2\pi i\left[\sum_k c_k Z_k(f)\right] L(f) \quad \text{Equation (6)}$$

where L (f) is real

Using such a lens pupil function, the TCC kernel of Eq. (2) can be approximated as:

$$\begin{aligned} TCC_{\alpha\beta}(f', f'') &= \iint d^2 f^i I^i_\beta(f^i) \tilde{P}^*_\alpha(f'' + f^i) \tilde{P}_\alpha(f' + f^i) \\ &\approx \iint d^2 f^i I^i_\beta(f^i) \left\{ L_\alpha(f'' + f^i) - 2\pi i\left[\sum_k c^*_k Z_k(f'' + f^i)\right] L_\alpha(f'' + f^i) \right\} \cdot \left\{ L_\alpha(f' + f^i) + 2\pi i\left[\sum_k c_k Z_k(f' + f^i)\right] L_\alpha(f' + f^i) \right\} \\ &\approx \iint d^2 f^i I^i_\beta(f^i) \Big\{ L_\alpha(f'' + f^i) L_\alpha(f' + f^i) - 2\pi i\left[\sum_k c^*_k Z_k(f'' + f^i)\right] L_\alpha(f'' + f^i) L_\alpha(f' + f^i) + \\ &\quad 2\pi i\left[\sum_k c_k Z_k(f' + f^i)\right] L_\alpha(f'' + f^i) L_\alpha(f' + f^i) \Big\} \end{aligned} \quad \text{Equation (7)}$$

Equation (7) can be further expanded as:

$$TCC_{\alpha\beta}(f', f'') \approx \iint d^2 f^i I_\beta^i(f^i) L_\alpha(f'' + f^i) L_\alpha(f' + f^i) -$$
$$2\pi i \sum_k c_k^* \iint d^2 f^i I_\beta^i(f^i) L_\alpha(f'' + f^i) Z_k(f'' + f^i) L_\alpha(f' + f^i) +$$
$$2\pi i \sum_k c_k \iint d^2 f^i I_\beta^i(f^i) L_\alpha(f'' + f^i) Z_k(f' + f^i) L_\alpha(f' + f^i)$$
$$= \iint d^2 f^i I_\beta^i(f^i) \{ L_\alpha(f'' + f^i) L_\alpha(f' + f^i) +$$
$$2\pi i \sum_k a_k \Big[ -i \iint d^2 f^i I_\beta^i(f^i) L_\alpha(f'' + f^i) Z_k(f'' + f^i) L_\alpha(f' + f^i) +$$
$$i \iint d^2 f^i I_\beta^i(f^i) L_\alpha(f'' + f^i) Z_k(f' + f^i) L_\alpha(f' + f^i) \Big] -$$
$$2\pi i \sum_k b_k \Big[ \iint d^2 f^i I_\beta^i(f^i) L_\alpha(f'' + f^i) Z_k(f'' + f^i) L_\alpha(f' + f^i) +$$
$$\iint d^2 f^i I_\beta^i(f^i) L_\alpha(f'' + f^i) Z_k(f' + f^i) L_\alpha(f' + f^i) \Big] \}$$

Equation (8)

where $c_k = a_k + i b_k$.

There are three terms on the right-hand-side of the above Equation (8). The first term $L_\alpha(f''+f^i)L_\alpha(f'+f^i)$ is the transmission cross matrix TCC for an ideal lens. The second term $2\pi i \Sigma_k a_k [-i \iint d^2 f^i I_\beta^i(f^i) L_\alpha(f''+f^i) Z_k(f''+f^i) L_\alpha(f'+f^i) + i \iint d^2 f^i I_\beta^i(f^i) L_\alpha(f''+f^i) Z_k(f'+f^i) L_\alpha(f'+f^i)]$ represents aberration, and the third term $\Sigma_k b_k [\iint d^2 f^i I_\beta^i(f^i) L_\alpha(f''+f^i) Z_k(f''+f^i) L_\alpha(f'+f^i) + \iint d^2 f^i I_\beta^i(f^i) L_\alpha(f''+f^i) Z_k(f'+f^i) L_\alpha(f'+f^i)]$ represents apodization. Coefficients $a_k$ and $b_k$ of the second and third terms, respectively, are slit-position dependent and are the coefficients of the perturbation kernels obtained at step 110 in FIG. 1. $a_k$ are the Zernike coefficients for aberration and $b_k$ are the Zernike coefficients for apodization.

The transmission cross coefficient matrix $TCC_{\alpha\beta}(f',f'')$ in Equation (7) can be decomposed into an ideal TCC kernel set and two perturbation kernel sets. The ideal TCC kernel set represents the effect of the optical system on transmitted and/or reflected light assuming every element in the optical system behaves ideally. The ideal TCC kernel set can be represented as $TCC_{ideal} = \Sigma_j |V_{\alpha\beta,j}(f'')\rangle \langle V_{\alpha\beta,j}(f')|$.

The decomposed transmission cross coefficient matrix may be represented as $$TCC_{\alpha\beta}(f', f'') \approx$$
$$\sum_j |V_{\alpha\beta,j}(f'')\rangle\langle V_{\alpha\beta,j}(f')| + \sum_{k,l} a_k |A_{\alpha\beta,k,l}(f'')\rangle\langle A_{\alpha\beta,k,l}(f')| -$$
$$\sum_{k,m} b_k |B_{\alpha\beta,k,m}(f'')\rangle\langle B_{\alpha\beta,k,m}(f')|$$

Equation (9)

where $\Sigma_{k,l} a_k |A_{\alpha\beta,k,l}(f'')\rangle \langle A_{\alpha\beta,k,l}(f')|$ represents the first perturbation kernel set and $\Sigma_{k,m} b_k |B_{\alpha\beta,k,m}(f'')\rangle \langle B_{\alpha\beta,k,m}(f')|$ represents the second perturbation kernel set. In Equation (9), $|A_{\alpha\beta,k,l}\rangle$ are the aberration kernels, $|B_{\alpha\beta,k,m}(f'')\rangle$ are the apodization kernels, $a_k$, $b_k$ are Zernike coefficients, and j, l, m are the indices of the ideal TCC kernel set, the first perturbation kernel sets, and the second perturbation kernel set, respectively.

In some embodiments, the transmission cross coefficient matrix $TCC_{\alpha\beta}$ is iteratively adjusted by using the difference between the printed wafer pattern (obtained at 206, FIG. 2) and the simulated wafer pattern obtained at 104 (FIG. 1) during the model calibration process in FIG. 2. For example, in some embodiments, a unitary matrix is used as a beginning coefficient matrix, and then iteratively changed to minimize the difference between the printed wafer pattern and the simulated wafer pattern.

Figure 4:
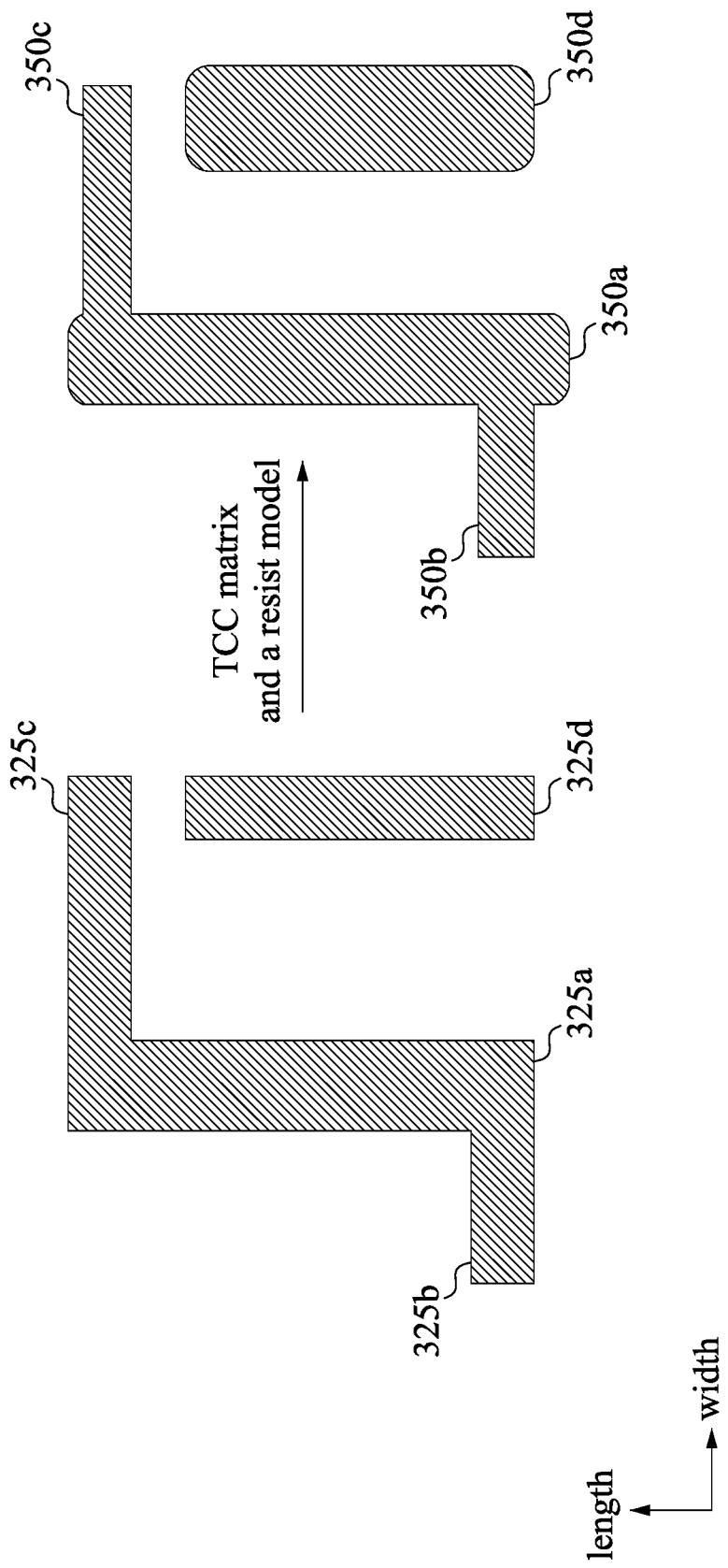
FIG. 4 schematically illustrates a simulated wafer pattern obtained using the methods disclosed in FIGS. 1, 2, and 3 together with a resist model in accordance with an embodiment of the present disclosure.

FIG. 4 schematically illustrates a simulated wafer pattern obtained using the methods disclosed in FIGS. 1, 2, and 3 together with a resist model. Specifically, FIG. 4 illustrates a simulated wafer pattern obtained using a single ideal TCC kernel set and one or more perturbation kernel sets including $a_k$, the Zernike coefficients for aberration, and $b_k$, the Zernike coefficients for apodization, as calculated above, and a resist model. For example, in an embodiment, layout 102 (FIG. 1) includes features 325a-325d forming a structure. Following the application of the ideal TCC kernel set and the one or more perturbation kernel sets and a resist model, the feature 325a is resized and reshaped to feature 350a depending on the properties of the particular optical system and the resist development process. For example, while the width of feature 350a remains the same as that of feature 325a, corners of feature 350a are rounded, and the length of feature 350a is greater than that of feature 325a. The resizing, reshaping and repositioning of various structures can be different depending on the particular optical system and the resist development process. Thus, as can be seen in FIG. 4, features 325b and 325c are transformed after application of the ideal TCC kernel set and the one or more perturbation kernel sets and a resist model to features 350b and 350c having a length smaller than that of features 325b and 325c. On the other hand, the width of feature 325d is increased after application of the ideal TCC kernel set and the one or more perturbation kernel sets to form feature 350d. As can also be seen in FIG. 4, the corners of the various features are rounded by varying degree after application of the ideal TCC kernel set and the one or more perturbation kernel sets and a resist model.

It should be noted that while FIG. 4 shows certain effects of application of the ideal kernel set and the one or more perturbation kernels and the resist model on certain features, the effects may be different for the same or similar features depending on various factors including, but not limited to, the properties of various elements in the optical system and the resist development process. Different features may be transformed differently. For example, while FIG. 4 shows an inward rounding of corners, corners of same or different features may get rounded outward, thereby expanding the features at their respective corners.

The perturbation kernel sets $\Sigma_{k,i} a_k |A_{\alpha\beta,k,i}(f'')\rangle\langle A_{\alpha\beta,k,i}(f')|$ and $\Sigma_{k,m} b_k |B_{\alpha\beta,k,m}(f'')\rangle\langle B_{\alpha\beta,k,m}(f')|$ represent the net effect of generally known non-ideal behavior of each of the elements in the optical system. For example, in some embodiments, a lens or a mirror has spherical aberration near its edges, which is represented by an aberration function. In other embodiments, first or higher order diffraction effects cause airy disks which are represented by a negative apodization functions.

In some embodiments, the TCC matrix includes additional terms representing other effects such as, for example, the effect of the wafer resist stack on the transmission and/or reflection of the actinic radiation on the wafer itself. In such embodiments, the transmission cross coefficient matrix is represented by:

$$TCC_{\alpha\beta}(f', f'') =$$
$$\iint d^2 f^i I_\beta^i(f^i) \tilde{P}_\alpha^*(f'' + f^i) \tilde{R}_\alpha^*(f'' + f^i) \tilde{R}_\alpha(f' + f^i) \tilde{P}_\alpha(f' + f^i) = $$
$$\sum_j |V_{\alpha\beta,j}(f'')\rangle\langle V_{\alpha\beta,j}(f')|$$

$\tilde{R}_\alpha$ represents the effect of wafer film stack including the image position in the resist and the image focusing. $\tilde{R}_\alpha(f'+f^i)$ is a factor to be multiplied in calculating a diffraction field (at wave number $f'+f^i$) at a certain depth inside the resist. This factor considers the electro-magnetic wave interference of material stacks above and below the resist layer. $\tilde{R}^*_\alpha(f''+f^i)$ is the complex conjugate of $\tilde{R}_\gamma(f'+f^i)$.

In some embodiments, lens birefringence effects are also included in determining the TCC matrix. In such embodiments, the TCC matrix is obtained using vectorial imaging theory as represented by:

$$I(x) = \sum_{\gamma,\alpha,\beta} \iint d^2 f'' \iint d^2 f' \tilde{T}^*_{\alpha\beta}(f'') \tilde{T}_{\alpha\beta}(f') \exp(i(f'-f'') \cdot x)) \cdot$$
$$TCC_{\gamma\alpha\beta}(f', f'')$$
$$TCC_{\gamma\alpha\beta}(f', f'') =$$
$$\iint d^2 f^i I_\beta^i(f^i) \tilde{P}_{\gamma\alpha}^+(f'' + f^i) \tilde{R}_\gamma^*(f'' + f^i) \tilde{R}_\gamma(f' + f^i) \tilde{P}_{\gamma\alpha}(f' + f^i) = $$
$$\sum_j |V_{\gamma\alpha\beta,j}(f'')\rangle\langle V_{\gamma\alpha\beta,j}(f')|$$

$\gamma$, $\alpha$, $\beta$ are polarization states.

The coefficients of the perturbation kernel sets represent localized defects in addition to the general non-ideal behavior of the optical elements. In other words, the coefficients are specific to the particular optical system being used. For example, in some embodiments, the coefficients are computed according to the mask location of various subsections of the mask layout. Such coefficients weight the perturbation kernel at corresponding locations to further change the features within that subsection when the simulated wafer pattern is calculated at 104. Thus, for optical systems with no localized defects, the coefficients are zeros. However, in practice, optical systems have some localized defects that cause optical distortions. In some cases, the localized defects are a result of processing steps during the manufacture of the individual components.

In some embodiments, a method of calibrating a lithography model includes computing a transmission cross coefficient matrix for an optical system to be used to describe a lithography process. The transmission cross coefficient matrix can be decomposed into an ideal transmission cross coefficient kernel set for a corresponding ideal optical system and at least two perturbation kernel sets. As discussed elsewhere herein, an ideal optical system assumes ideal optical properties for each element of the optical system. The perturbation kernel sets represent the net effect of optical defects typically observed in each of the elements of the optical system. In other words, the perturbation kernel sets represent the net effect of optical defects assuming that the elements of the optical system are real, and therefore, have non-ideal behavior. The coefficients of the perturbation kernel sets represent the net effect of local defects in various elements of the optical system. The local defects, in various embodiments, include defects at specific locations of an individual element in the optical system such as, for example, a crystal defect in a thin film of a multi-layer stack for an EUV mirror, relative to a given mask layout. The local defects, in some embodiments, are generated during the manufacturing process of a particular element of the optical system. In other embodiments, the local defects are generated during use of a particular element of the optical system.

A simulated wafer pattern is then computed by applying the transmission cross coefficient matrix to the given mask layout. A wafer is printed using a mask written by the given mask layout and the pattern printed on the wafer is measured. The difference between the simulated wafer pattern and the printed pattern measured from the wafer is then used to iteratively adjust the lithography model.

Figure 5:
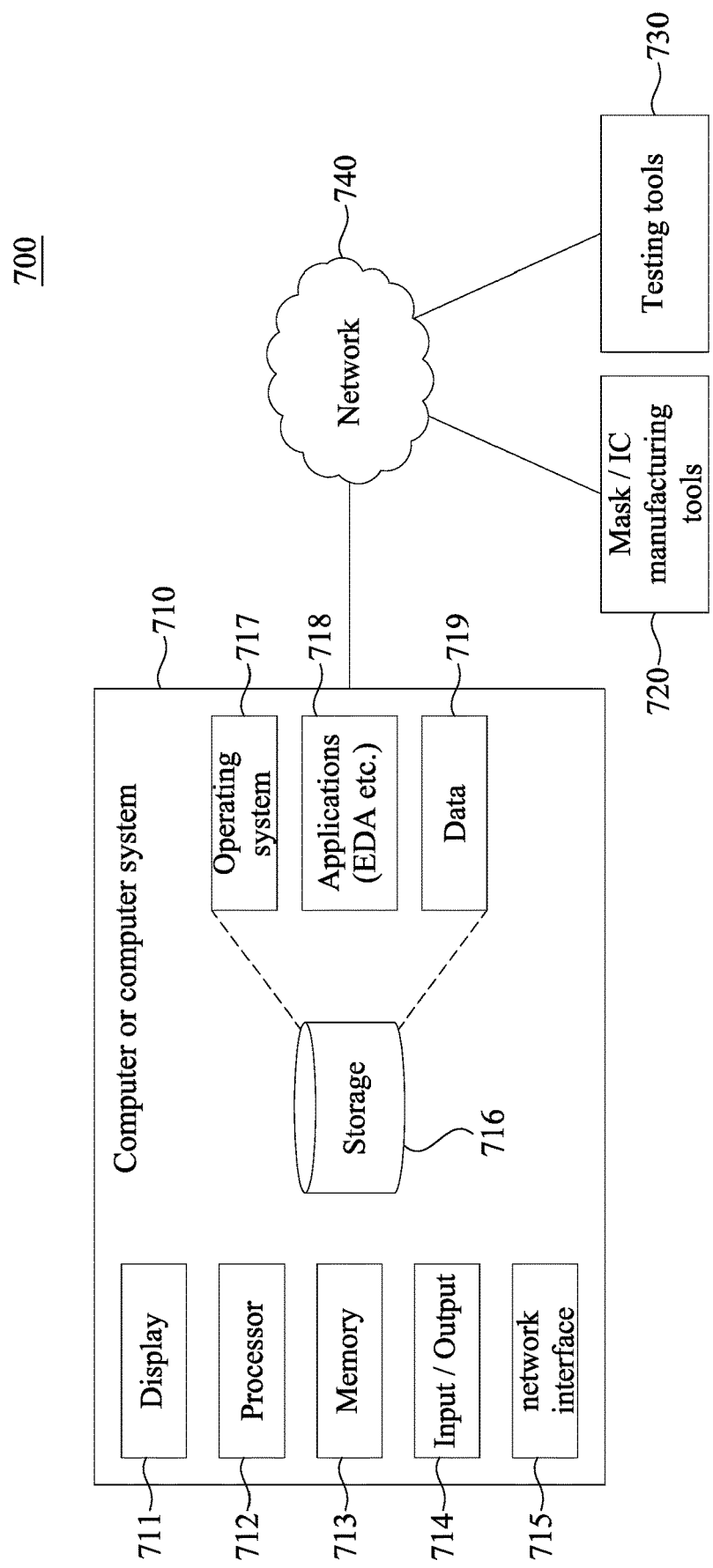
FIG. 5 illustrates a system for making an integrated circuit (IC) in accordance with some embodiments of the disclosure.

FIG. 5 illustrates a system for making an IC in accordance with some embodiments. The system 700 includes a computer or a computer system 710, mask and IC manufacturing tools 720, testing tools 730, and a wireless or wired network 740 connecting the computer system 710, the mask and IC manufacturing tools 720, and the testing tools 730 to each other to allow data exchange therebetween.

The computer or the computer system 710 includes a display 711, a processor 712, a memory 713, an input/output interface 714, a network interface 715, and a storage 716 storing an operating system 717, programs or applications 718 such as EAD, and data 719.

The applications 718 can include instructions which, when executed by the computer or the computer system 710 (or the processor 712 thereof), causes the computer or the computer system 710 (or the processor 712 thereof) to perform operations, methods, and/or processes that are explicitly or implicitly described in the present disclosure.

The data 719 can include any default data including default parameters used in the modeling, any data that is received, for example, through the user input via input/output interface or through the network interface 715 transmitted from the mask/IC manufacturing tools 720 and/or testing tools 730, any data that is to be displayed on the display 711, any data that is to be transmitted to or from the mask/IC manufacturing tools 720 and/or testing tools 730 via the network 740, or any interim data generated during computation by the computer or computer system 710.

The mask and IC manufacturing tools 720 include but are not limited to an e-beam writer or an e-beam lithography tool, a photolithography tool, etc., and the testing tools 730 include but are not limited to a surface profile measurement tools such as a scanning electron microscope.

Those of skill in the art will appreciate that because the method described herein accounts for the location based defects of the particular optical system being used for lithography, the simulated wafer pattern, and the mask generated therefrom accurately pre-compensate for the defects in the system. Moreover, because the calibration and/or tuning of the lithography model requires adjusting its parameters, the transmission cross coefficient matrix can be tuned directly at a relatively low computation cost and at a relatively fast speed.

It will be understood that not all advantages have been necessarily discussed herein, no particular advantage is required for all embodiments or examples, and other embodiments or examples may offer different advantages.

According to an aspect of the present disclosure, a method of making a mask includes computing a transmission cross coefficient (TCC) matrix for an optical system for performing a lithography process. The computing includes decomposing the transmission cross coefficient matrix into an ideal transmission cross coefficient (TCC) kernel set for a corresponding ideal optical system and at least one perturbation kernel set with coefficients corresponding to optical defects in the optical system. A lithography model is calibrated by iteratively adjusting the lithography model based on a comparison between simulated wafer patterns and measured printed wafer patterns. The calibrated lithography model, which includes an ideal TCC kernel set, the at least two perturbation kernels sets, and a resist model is provided to a mask layout synthesis tool to obtain a synthesized mask layout corresponding to a target mask layout for manufacturing the mask using the synthesized mask layout. In some embodiments, the printed wafer patterns are obtained using a test mask that is fabricated using a test mask layout. In some embodiments, the simulated wafer patterns are obtained by applying the lithography model including the ideal TCC kernel set, the at least two perturbation kernels sets, and the resist model to the test mask layout. In some embodiments, the perturbation kernel sets include a first perturbation kernel set corresponding to aberration in the optical system and a second perturbation kernel set corresponding to apodization in the optical system. In some embodiments, the transmission cross coefficient matrix is represented by:

$$TCC_{\alpha\beta}(f', f'') \approx \sum_j |V_{\alpha\beta,j}(f'')\rangle\langle V_{\alpha\beta,j}(f')| + \sum_{k,l} a_k |A_{\alpha\beta,k,l}(f'')\rangle\langle A_{\alpha\beta,k,l}(f')| - \sum_{k,m} b_k |B_{\alpha\beta,k,m}(f'')\rangle\langle B_{\alpha\beta,k,m}(f')|$$

wherein $\sum_j |V_{\alpha\beta,j}(f'')\rangle\langle V_{\alpha\beta,j}(f')|$ represents the transmission cross coefficient (TCC) kernel set for the corresponding ideal optical system, $|V_{\alpha\beta,j}\rangle$ are the ideal transmission cross coefficient kernels, $a_k$ are Zernike coefficients for aberration and $b_k$ are Zernike coefficients for apodization, k is an index of Zernike polynomials $|A_{\alpha\beta,k,l}\rangle$ and $|B_{\alpha\beta,k,m}\rangle$ respectively representing the first perturbation kernel set and the second perturbation kernel set, j, l and m are indices of the ideal TCC kernel set, the first perturbation kernel set, and the second perturbation kernel set, respectively, and f' and f'' are wavenumbers of diffraction fields. In some embodiments, the single ideal TCC kernel set and the at least one perturbation kernel set and the coefficients of the at least two perturbation kernel sets are based on a lens pupil function representing the optical system. In some embodiments, the lens pupil function is represented by:

$$A_\alpha(f) \approx \exp\left\{i2\pi\left[\sum_k c_k Z_k(f)\right]\right\}$$

where $Z_k$ is an even or an odd Zernike polynomial, $c_k$ is a complex number that is represented as $c_k = a_k + ib_k$, where $a_k$ are Zernike coefficients for aberration and $b_k$ are Zernike coefficients for apodization, and f is a wavenumber of a diffraction field. In some embodiments, the Zernike coefficients represent defects in the optical system as a function of a location relative to the given mask layout. In some embodiments, the TCC matrix considers a lens birefringence effect that represents polarization dependent effects of the optical system as a function of a location relative to the given mask layout. In some embodiments, wherein the transmission cross coefficient matrix is represented as $$TCC_{\gamma\alpha\beta}(f', f'') = \int\int d^2 f^i I_\beta^i(f^i)\tilde{P}_{\gamma\alpha}^+(f'' + f^i)\tilde{R}_\gamma^+(f'' + f^i)\tilde{R}_\gamma(f' + f^i)\tilde{P}_{\gamma\alpha}(f' + f^i) = \sum_j |V_{\gamma\alpha\beta,j}(f'')\rangle\langle V_{\gamma\alpha\beta,j}(f')|$$

and image computation using the lens birefringence effect is represented by:

$$I(x) = \sum_{\alpha,\beta,\gamma} \int\int d^2 f'' \int\int d^2 f' \tilde{T}_{\alpha\beta}^*(f'')\tilde{T}_{\alpha\beta}(f')\exp(i(f' - f'') \cdot x) \cdot TCC_{\gamma\alpha\beta}(f', f'')$$

wherein $\alpha$, $\beta$, $\gamma$ represent the polarization states, V is the transmission cross coefficient kernel, f', f'' and f$^i$ are points in frequency domain, and $\tilde{R}$ represents an effect of a wafer film stack, and $\tilde{P}$ represents a pupil function for the optical system. $\tilde{R}_\gamma(f'+f^i)$ is a factor to be multiplied in calculating a diffraction field (at wave number f'+f$^i$) at a certain depth inside the resist. This factor considers the electro-magnetic wave interference of material stacks above and below the resist layer. $\tilde{R}_\gamma^+$ (f'+f$^i$) is the complex conjugate of $\tilde{R}_\gamma$(f'+f$^i$). In some embodiments, the TCC matrix is iteratively adjusted based on a comparison between a printed wafer pattern and the simulated wafer pattern.

According to another aspect of the present disclosure, a method of calibrating a lithography model includes computing a transmission cross coefficient (TCC) matrix for an optical system for performing a lithography process. Computing the TCC matrix includes decomposing the TCC matrix into a single ideal TCC kernel set for a corresponding ideal optical system and at least two perturbation kernel sets, wherein coefficients of the at least two perturbation kernel sets correspond to optical defects in the optical system. A lithography model is calibrated by iteratively adjusting the lithography model based on a comparison between simulated wafer patterns and measured printed wafer patterns. In some embodiments, the printed wafer patterns are obtained using a test mask that is fabricated using a test mask layout. In some embodiments, the simulated wafer patterns are obtained by applying a lithography model including an ideal TCC kernel set, at least two perturbation kernels sets, and a resist model to the test mask layout. In some embodiments, the at least two perturbation kernel sets include a first perturbation kernel set corresponding to aberration in the optical system and a second perturbation kernel set corresponding to apodization in the optical system. In some embodiments, the TCC matrix is represented by:

$$TCC_{\alpha\beta}(f', f'') \approx \sum_j |V_{\alpha\beta,j}(f'')\rangle\langle V_{\alpha\beta,j}(f')| +$$

$$\sum_{k,l} a_k |A_{\alpha\beta,k,l}(f'')\rangle\langle A_{\alpha\beta,k,l}(f')| - \sum_{k,m} b_k |B_{\alpha\beta,k,m}(f'')\rangle\langle B_{\alpha\beta,k,m}(f')|$$

wherein $\sum_j |V_{\alpha\beta,j}(f'')\rangle\langle V_{\alpha\beta,j}(f')|$ represents the transmission cross coefficient (TCC) kernel set for the corresponding ideal optical system, $|V_{\alpha\beta,j}\rangle$ are the TCC kernels, $a_k$ are Zernike coefficients for aberration and $b_k$ are Zernike coefficients for apodization, k is an index of Zernike polynomials $|A_{\alpha\beta,k,l}\rangle$ and $|B_{\alpha\beta,k,m}\rangle$ respectively representing the first perturbation kernel set and the second perturbation kernel set, j, l and m are indices of the single ideal TCC kernel set, the first perturbation kernel set, and the second perturbation kernel set, respectively, and f' and f" are wavenumbers of diffraction fields. In some embodiments, the single ideal TCC kernel set and the at least two perturbation kernels set and the coefficients of the at least two perturbation kernel sets are based on a lens pupil function representing the optical system. In some embodiments, the lens pupil function is represented by:

$$A_\alpha(f) = \exp\left\{i2\pi\left[\sum_k c_k Z_k(f)\right]\right\}$$

where $Z_k$ is an even or an odd Zernike polynomial, $c_k$ is a complex number that is represented as $c_k = a_k + ib_k$, where $a_k$ are Zernike coefficients for aberration and $b_k$ are Zernike coefficients for apodization, and f is a wavenumber of a diffraction field. In some embodiments, the TCC matrix is computed using a lens birefringence effect that represents polarization dependent effects of the optical system as a function of a location relative to the given mask layout. In some embodiments, wherein the transmission cross coefficient matrix is represented as $$TCC_{\gamma\alpha\beta}(f', f'') =$$

$$\int\int d^2 f^i I_\beta^i(f^i) \tilde{P}_{\gamma\alpha}^+(f'' + f^i) \tilde{R}_\gamma^*(f'' + f^i) \tilde{R}_\gamma(f' + f^i) \tilde{P}_{\gamma\alpha}(f' + f^i) =$$

$$\sum_j |V_{\gamma\alpha\beta,j}(f'')\rangle\langle V_{\gamma\alpha\beta,j}(f')|$$

and image computation using the lens birefringence TCC matrix is represented by:

$$I(x) = \sum_{\alpha,\beta,\gamma} \int\int d^2 f''$$

$$\int\int d^2 f' \tilde{T}_{\alpha\beta}^*(f'') \tilde{T}_{\alpha\beta}(f') \exp(i(f' - f'') \cdot x) \cdot TCC_{\gamma\alpha\beta}(f', f'')$$

α, β, γ are polarization states, V is the transmission cross coefficient kernel, f', f" and $f^i$ are points in frequency domain, $\tilde{R}$ represents an effect of wafer film stack, and $\tilde{P}$ represents a pupil function for the optical system. $\tilde{R}_\gamma(f'+f^i)$ is a factor to be multiplied in calculating a diffraction field (at wave number $f'+f^i$) at a certain depth inside the resist. This factor considers the electro-magnetic wave interference of material stacks above and below the resist layer. $\tilde{R}_\gamma^*(f'+f^i)$ is the complex conjugate of $\tilde{R}_\gamma(f'+f^i)$.

According to yet another aspect of the present disclosure, a tool for making a lithography mask includes a processor, and a memory operably connected to the processor and having a computer-executable instructions stored thereon. The instructions when executed cause the processor to receive a given mask layout. A transmission cross coefficient (TCC) matrix for an optical system for performing a lithography process is then computed. Computing the TCC matrix includes decomposing the TCC matrix into an ideal TCC kernel set for a corresponding ideal optical system and at least two perturbation kernels sets having coefficients corresponding to optical defects in the optical system. A lithography model is calibrated by iteratively adjusting the lithography model based on a comparison between simulated wafer patterns and measured printed wafer patterns. The calibrated lithography model, which includes an ideal TCC kernel set and the at least two perturbation kernels sets and a resist model, is provided to a mask layout synthesis tool to obtain a synthesized mask layout corresponding to a target mask layout for manufacturing the lithography mask using the synthesized mask layout. The printed wafer patterns are obtained using a test mask that is fabricated using a test mask layout, and the simulated wafer patterns are obtained by applying a lithography model including an ideal TCC kernel set, at least two perturbation kernels sets, and a resist model to the test mask layout. In some embodiments, the transmission cross coefficient matrix is represented by:

$$TCC_{\alpha\beta}(f', f'') \approx \sum_j |V_{\alpha\beta,j}(f'')\rangle\langle V_{\alpha\beta,j}(f')| +$$

$$\sum_{k,l} a_k |A_{\alpha\beta,k,l}(f'')\rangle\langle A_{\alpha\beta,k,l}(f')| - \sum_{k,m} b_k |B_{\alpha\beta,k,m}(f'')\rangle\langle B_{\alpha\beta,k,m}(f')|$$

wherein $\sum_j |V_{\alpha\beta,j}(f'')\rangle\langle V_{\alpha\beta,j}(f')|$ represents the transmission cross coefficient (TCC) kernel set for the corresponding ideal optical system, $|V_{\alpha\beta,j}\rangle$ are the transmission cross coefficient kernels, $a_k$ are Zernike coefficients for aberration and $b_k$ are Zernike coefficients for apodization, k is an index of Zernike polynomials $|A_{\alpha\beta,k,l}\rangle$ and $|B_{\alpha\beta,k,m}\rangle$ respectively representing the first perturbation kernels and the second perturbation kernels, j, l and m are indices of the (ideal) TCC kernel set, the first perturbation kernel set, and the second perturbation kernel set, respectively, and f' and f" are wavenumbers of diffraction fields. In some embodiments, wherein the perturbation kernel includes a lens pupil function representing the optical system, the lens pupil function being represented by:

$$A_\alpha(f) = \exp\left\{i2\pi\left[\sum_k c_k Z_k(f)\right]\right\}$$

where $Z_k$ is an even or an odd Zernike polynomial, $c_k$ is a complex number that is represented as $c_k=a_k+ib_k$, where $a_k$ are Zernike coefficients for aberration and $b_k$ are Zernike coefficients for apodization, and f is a point in a frequency domain. In some embodiments, the single TCC kernel set and the at least two perturbation kernel set and the coefficients of the at least two perturbation kernel sets are based on a lens pupil function representing the optical system. In some embodiments, the lens birefringence image computation is represented by:

$$I(x) = \sum_{\alpha,\beta,\gamma} \int \int d^2 f''$$

$$\int \int d^2 f' \tilde{T}^*_{\alpha\beta}(f'') \tilde{T}_{\alpha\beta}(f') \exp(i(f'-f'') \cdot x) \cdot TCC_{\gamma\alpha\beta}(f',f'')$$

where $$TCC_{\gamma\alpha\beta}(f',f'') =$$

$$\int \int d^2 f^i I^i_\beta(f^i) \tilde{P}^+_{\gamma\alpha}(f''+f^i) \tilde{R}^+_\gamma(f''+f^i) \tilde{R}_\gamma(f'+f^i) \tilde{P}_{\gamma\alpha}(f'+f^i) =$$

$$\sum_j |V_{\gamma\alpha\beta,j}(f'')\rangle\langle V_{\gamma\alpha\beta,j}(f')|$$

where α, β, γ are polarization states, V is the transmission cross coefficient kernel, f', f" and f$^i$ are wavenumbers of diffraction fields, and $\tilde{R}$ represents an effect of a wafer film stack, and $\tilde{P}$ represents a pupil function for the optical system.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a mask, the method comprising:
computing a transmission cross coefficient (TCC) matrix for an optical system for performing a lithography process, wherein computing includes decomposing the transmission cross coefficient matrix into an ideal transmission cross coefficient (TCC) kernel set for a corresponding ideal optical system and at least one perturbation kernel set with coefficients corresponding to optical defects in the optical system;
calibrating a lithography model by iteratively adjusting the lithography model based on a comparison between simulated wafer patterns and measured printed wafer patterns; and
providing the calibrated lithography model, which includes an ideal TCC kernel set and the at least two perturbation kernels sets and a resist model, to a mask layout synthesis tool to obtain a synthesized mask layout corresponding to a target mask layout for manufacturing the mask using the synthesized mask layout.

2. The method of claim 1, wherein the printed wafer patterns are obtained using a test mask that is fabricated using a test mask layout.

3. The method of claim 1, wherein the simulated wafer patterns are obtained by applying the lithography model including the ideal TCC kernel set, the at least two perturbation kernels sets, and the resist model to the test mask layout.

4. The method of claim 1, wherein the at least one perturbation kernel set comprises a first perturbation kernel set corresponding to aberration in the optical system and a second perturbation kernel set corresponding to apodization in the optical system.

5. The method of claim 4, wherein the transmission cross coefficient matrix is represented by:

$$TCC_{\alpha\beta}(f',f'') \approx \sum_j |V_{\alpha\beta,j}(f'')\rangle\langle V_{\alpha\beta,j}(f')| +$$

$$\sum_{k,l} a_k |A_{\alpha\beta,k,l}(f'')\rangle\langle A_{\alpha\beta,k,l}(f')| - \sum_{k,m} b_k |B_{\alpha\beta,k,m}(f'')\rangle\langle B_{\alpha\beta,k,m}(f')|$$

wherein $\sum_j |V_{\alpha\beta,j}(f'')\rangle\langle V_{\alpha\beta,j}(f')|$ represents the transmission cross coefficient (TCC) kernel set for the corresponding ideal optical system, $|V_{\alpha\beta,j}\rangle$ are the ideal transmission cross coefficient kernels, $a_k$ are Zernike coefficients for aberration and $b_k$ are Zernike coefficients for apodization, k is an index of Zernike polynomials $|A_{\alpha\beta,k,l}\rangle$ and $|B_{\alpha\beta,k,m}\rangle$ respectively representing the first perturbation kernel set and the second perturbation kernel set, j, l and m are indices of the ideal TCC kernel set, the first perturbation kernel set, and the second perturbation kernel set, respectively, and f' and f" are wavenumbers of diffraction fields.

6. The method of claim 1, wherein the ideal TCC kernel set and the at least one perturbation kernel set and the coefficients of the at least two perturbation kernel sets are based on a lens pupil function representing the optical system.

7. The method of claim 6, wherein the lens pupil function is represented by:

$$A_\alpha(f) = \exp\left\{i2\pi\left[\sum_k c_k Z_k(f)\right]\right\}$$

where $Z_k$ is an even or an odd Zernike polynomial, $c_k$ is a complex number that is represented as $c_k=a_k+ib_k$, where $a_k$ are Zernike coefficients for aberration and $b_k$ are Zernike coefficients for apodization, and f is a wavenumber of a diffraction field.

8. The method of claim 7, wherein the Zernike coefficients represent defects in the optical system as a function of a location relative to the given mask layout.

9. The method of claim 1, wherein the transmission cross coefficient matrix considers a lens birefringence effect that represents polarization dependent effects of the optical system as a function of a location relative to the given mask layout.

10. The method of claim 9, wherein the transmission cross coefficient matrix is represented as $$TCC_{\gamma\alpha\beta}(f',f'') =$$
$$\iint d^2 f^i I^i_\beta(f^i) \tilde{P}^+_{\gamma\alpha}(f''+f^i) \tilde{R}^+_\gamma(f''+f^i) \tilde{R}_\gamma(f'+f^i) \tilde{P}_{\gamma\alpha}(f'+f^i) =$$
$$\sum_j |V_{\gamma\alpha\beta,j}(f'')\rangle\langle V_{\gamma\alpha\beta,j}(f')|$$

and image computation using the lens birefringence TCC matrix is represented by:

$$I(x) = \sum_{\alpha,\beta,\gamma} \iint d^2 f''$$
$$\iint d^2 f' \tilde{T}^*_{\alpha\beta}(f'') \tilde{T}_{\alpha\beta}(f') \exp(i(f'-f'')\cdot x) \cdot TCC_{\gamma\alpha\beta}(f',f'')$$

α, β, γ are polarization states, V is the transmission cross coefficient kernel, f', f" and f$^i$ are points in frequency domain, and $\tilde{R}$ represents an effect of a wafer film stack, and $\tilde{P}$ represents a pupil function for the optical system.

11. The method of claim 1, further comprising iteratively adjusting the transmission cross coefficient matrix is based on a comparison between a printed wafer pattern and the simulated wafer pattern.

12. A method of calibrating a lithography model, the method comprising:

computing a transmission cross coefficient (TCC) matrix for an optical system for performing a lithography process, wherein computing the TCC matrix incudes decomposing the TCC matrix into a single ideal TCC kernel set for a corresponding ideal optical system and at least two perturbation kernel sets, wherein coefficients of the at least two perturbation kernel sets correspond to optical defects in the optical system;

calibrating a lithography model includes iteratively adjusting the lithography model by comparing simulated wafer patterns to measurements of printed wafer patterns;

providing the calibrated lithography model including the calibrated ideal TCC kernel set and the calibrated at least two perturbation kernels sets and a resist model to obtain a synthesized mask layout corresponding to a target mask layout; and printing a wafer using a mask obtained from the synthesized mask layout.

13. The method of claim 12, wherein the printed wafer patterns are obtained using a test mask that is fabricated using a test mask layout.

14. The method of claim 12, wherein the simulated wafer patterns are obtained by applying a lithography model including an ideal TCC kernel set, at least two perturbation kernels sets, and a resist model to the test mask layout.

15. The method of claim 12, wherein the at least two perturbation kernel sets comprise a first perturbation kernel set corresponding to aberration in the optical system and a second perturbation kernel set corresponding to apodization in the optical system, and wherein the TCC matrix is represented by:

$$TCC_{\alpha\beta}(f',f'') \approx \sum_j |V_{\alpha\beta,j}(f'')\rangle\langle V_{\alpha\beta,j}(f')| +$$
$$\sum_{k,l} a_k |A_{\alpha\beta,k,l}(f'')\rangle\langle A_{\alpha\beta,k,l}(f')| - \sum_{k,m} b_k |B_{\alpha\beta,k,m}(f'')\rangle\langle B_{\alpha\beta,k,m}(f')|$$

wherein $\sum_j |V_{\alpha\beta,j}(f'')\rangle\langle V_{\alpha\beta,j}(f')|$ represents the single ideal transmission cross coefficient (TCC) kernel set for the corresponding ideal optical system, $|V_{\alpha\beta,j}\rangle$ are the ideal transmission cross coefficient kernels, $a_k$ are Zernike coefficients for aberration and $b_k$ are Zernike coefficients for apodization, k is an index of Zernike polynomials $|A_{\beta\beta,k,l}\rangle$ and $|B_{\alpha\beta,k,m}\rangle$ respectively representing the first perturbation kernel set and the second perturbation kernel set, j, l and m are indices of the single ideal TCC kernel set, the first perturbation kernel set, and the second perturbation kernel set, respectively, and f' and f" are wavenumbers of diffraction fields.

16. The method of claim 12, wherein the single ideal TCC kernel set and the at least two perturbation kernel sets and the coefficients of the at least two perturbation kernel sets are based on a lens pupil function representing the optical system and wherein the lens pupil function is represented by:

$$A_\alpha(f) = \exp\left\{i2\pi\left[\sum_k c_k Z_k(f)\right]\right\}$$

where $Z_k$ is an even or an odd Zernike polynomial, $c_k$ is a complex number that is represented as $c_k = a_k + ib_k$, where $a_k$ are Zernike coefficients for aberration and $b_k$ are Zernike coefficients for apodization, and f is a wavenumber of a diffraction field.

17. The method of claim 12, wherein the TCC matrix is computed using a lens birefringence effect that represents polarization dependent effects of the optical system as a function of a location relative to the given mask layout and wherein the TCC matrix is represented as $$TCC_{\gamma\alpha\beta}(f',f'') =$$
$$\iint d^2 f^i I^i_\beta(f^i) \tilde{P}^+_{\gamma\alpha}(f''+f^i) \tilde{R}^+_\gamma(f''+f^i) \tilde{R}_\gamma(f'+f^i) \tilde{P}_{\gamma\alpha}(f'+f^i) =$$
$$\sum_j |V_{\gamma\alpha\beta,j}(f'')\rangle\langle V_{\gamma\alpha\beta,j}(f')|$$

and image computation using the lens birefringence TCC matrix is represented by:

$$I(x) = \sum_{\alpha,\beta,\gamma} \iint d^2 f''$$
$$\iint d^2 f' \tilde{T}^*_{\alpha\beta}(f'') \tilde{T}_{\alpha\beta}(f') \exp(i(f'-f'')\cdot x) \cdot TCC_{\gamma\alpha\beta}(f',f'')$$

α, β, γ are polarization states, V is the transmission cross coefficient kernel, f', f" and f$^i$ are points in frequency domain, and $\tilde{R}$ represents an effect of a wafer film stack, and $\tilde{P}$ represents a pupil function for the optical system.

18. A tool for making a lithography mask, the tool comprising:
- a processor; and
- a memory operably connected to the processor, and having a computer-executable instructions stored thereon, the instructions when executed cause the processor to:
  - receive a mask layout;
  - compute a transmission cross coefficient (TCC) matrix for an optical system for performing a lithography process, wherein computing includes decomposing the TCC matrix into an ideal TCC kernel set for a corresponding ideal optical system and at least two perturbation kernels sets having coefficients corresponding to optical defects in the optical system;
  - calibrate a lithography model by iteratively adjusting the lithography model based on a comparison between simulated wafer patterns and measured printed wafer patterns; and
  - provide the calibrated lithography model, which includes an ideal TCC kernel set and the at least two perturbation kernels sets and a resist model, to a mask layout synthesis tool to obtain a synthesized mask layout corresponding to a target mask layout for manufacturing the lithography mask using the synthesized mask layout, wherein
    - the printed wafer patterns are obtained using a test mask that is fabricated using a test mask layout, and
    - the simulated wafer patterns are obtained by applying a lithography model including an ideal TCC kernel set, at least two perturbation kernels sets, and a resist model to the test mask layout.

19. The tool of claim 18, wherein the TCC matrix is represented by:

$$TCC_{\alpha\beta}(f', f'') \approx \sum_j |V_{\alpha\beta,j}(f'')\rangle\langle V_{\alpha\beta,j}(f')| + \sum_{k,l} a_k |A_{\alpha\beta,k,l}(f'')\rangle\langle A_{\alpha\beta,k,l}(f')| - \sum_{k,m} b_k |B_{\alpha\beta,k,m}(f'')\rangle\langle B_{\alpha\beta,k,m}(f')|$$

wherein $\sum_j |V_{\alpha\beta,j}(f'')\rangle\langle V_{\alpha\beta,j}(f')|$ represents the transmission cross coefficient (TCC) kernel set for the corresponding ideal optical system, $|V_{\alpha\beta,j}\rangle$ are the ideal transmission cross coefficient kernels, $a_k$ are Zernike coefficients for aberration and $b_k$ are Zernike coefficients for apodization, k is an index of Zernike polynomials $|A_{\alpha\beta,k,l}\rangle$ and $|B_{\alpha\beta,k,m}\rangle$ respectively representing a first perturbation kernel and a second perturbation kernel of the at least two perturbation kernel sets, j, l and m are indices of the single TCC kernel set, the first perturbation kernel set, and the second perturbation kernel set, respectively, and f' and f'' are wavenumbers of diffraction fields.

20. The tool of claim 18, wherein the single TCC kernel set and the at least two perturbation kernel sets and the coefficients of the at least two perturbation kernel sets are based on a lens pupil function representing the optical system, the lens pupil function being represented by:

$$A_\alpha(f) = \exp\left\{i2\pi\left[\sum_k c_k Z_k(f)\right]\right\}$$

where $Z_k$ is an even or an odd Zernike polynomial, $c_k$ is a complex number that is represented as $c_k = a_k + ib_k$, where $a_k$ are Zernike coefficients for aberration and $b_k$ are Zernike coefficients for apodization, and f is a wavenumber of a diffraction field.

21. The tool of claim 18, wherein the TCC matrix is computed using a lens birefringence effect that represents polarization dependent effects of the optical system as a function of a location relative to a given mask layout, and wherein the transmission cross coefficient matrix is represented as $$TCC_{\gamma\alpha\beta}(f', f'') = \iint d^2 f^i \tilde{I}_\beta(f^i) \tilde{P}^+_{\gamma\alpha}(f'' + f^i) \tilde{R}^+_\gamma(f'' + f^i) \tilde{R}_\gamma(f' + f^i) \tilde{P}_{\gamma\alpha}(f' + f^i) = \sum_j |V_{\gamma\alpha\beta,j}(f'')\rangle\langle V_{\gamma\alpha\beta,j}(f')|$$

an image computation using the lens birefringence effect is represented by:

$$I(x) = \sum_{\alpha,\beta,\gamma} \iint d^2 f'' \iint d^2 f' \tilde{T}^*_{\alpha\beta}(f'') \tilde{T}_{\alpha\beta}(f') \exp(i(f' - f'') \cdot x) \cdot TCC_{\gamma\alpha\beta}(f', f'')$$

where $\alpha, \beta, \gamma$ are polarization states, V is the transmission cross coefficient kernel, f', f'' and $f^i$ are wavenumbers of diffraction fields, and $\tilde{R}$ represents an effect of a wafer film stack, and $\tilde{P}$ represents a pupil function for the optical system.

* * * * *